United States Patent
Huang et al.

(10) Patent No.: US 11,587,602 B2
(45) Date of Patent: Feb. 21, 2023

(54) TIMING SIGNAL DELAY COMPENSATION IN A MEMORY DEVICE

(71) Applicant: Micron Technology, Inc., Boise, ID (US)

(72) Inventors: Zhi Qi Huang, Shanghai (CN); Wei Lu Chu, Shanghai (CN); Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/526,846

(22) Filed: Nov. 15, 2021

(65) Prior Publication Data

US 2022/0076720 A1    Mar. 10, 2022

Related U.S. Application Data

(62) Division of application No. 16/843,628, filed on Apr. 8, 2020, now Pat. No. 11,200,927.

(51) Int. Cl.
    *G11C 7/22* (2006.01)
    *G11C 7/04* (2006.01)
    *G11C 7/10* (2006.01)

(52) U.S. Cl.
    CPC .............. *G11C 7/222* (2013.01); *G11C 7/04* (2013.01); *G11C 7/1051* (2013.01); *G11C 7/1072* (2013.01); *G11C 7/1078* (2013.01)

(58) Field of Classification Search
    CPC ......... G11C 7/222; G11C 7/04; G11C 7/1051; G11C 7/1078
    See application file for complete search history.

(56) References Cited

U.S. PATENT DOCUMENTS

| | | | |
|---|---|---|---|
| 5,241,506 A | 8/1993 | Motegi et al. | |
| 5,668,774 A * | 9/1997 | Furutani | G11C 8/18 365/233.5 |
| 5,920,221 A | 7/1999 | Shen et al. | |
| 6,023,429 A | 2/2000 | Mecier et al. | |
| 6,141,266 A | 10/2000 | Mecier et al. | |
| 2005/0213394 A1* | 9/2005 | Namekawa | G11C 7/1051 365/189.02 |
| 2013/0163353 A1* | 6/2013 | Hiraishi | G11C 7/222 365/194 |

* cited by examiner

*Primary Examiner* — Tuan T Nguyen
(74) *Attorney, Agent, or Firm* — Holland & Hart LLP

(57) ABSTRACT

Methods, systems, and devices for timing signal delay compensation in a memory device are described. In some memory devices, operations for accessing memory cells may be performed with timing that is asynchronous relative to an input signal. To support asynchronous timing, a memory device may include delay components that support generating a timing signal having aspects that are delayed relative to an input signal. In accordance with examples as disclosed herein, a memory device may include delay components having a variable and configurable impedance, where the configurable impedance may be based at least in part on a configuration signal generated at the memory device. A configuration signal may be generated based on fabrication characteristics of the memory device, or based on operating conditions of the memory device, or various combinations thereof.

20 Claims, 8 Drawing Sheets

TIMING SIGNAL DELAY COMPENSATION IN A MEMORY DEVICE

CROSS REFERENCE

The present application for patent claims the benefit of U.S. Provisional patent application Ser. No. 16/843,628 by HUANG et al., entitled "TIMING SIGNAL DELAY COMPENSATION IN A MEMORY DEVICE," filed Apr. 8, 2020, assigned to the assignee hereof, and expressly incorporated by reference herein.

BACKGROUND

The following relates generally to one or more memory systems and more specifically to timing signal delay compensation in a memory device.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
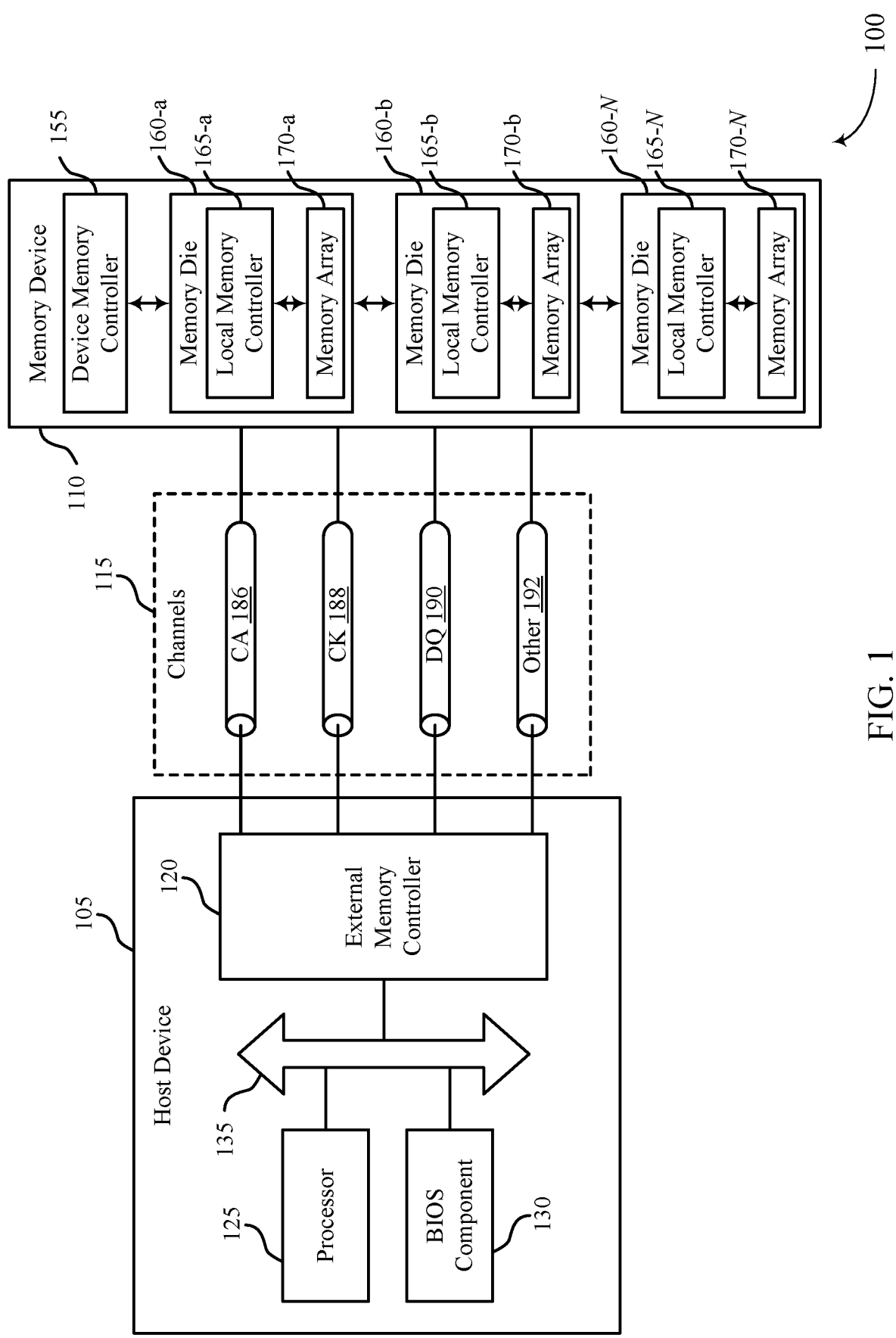
FIG. 1 illustrates an example of a system that supports timing signal delay compensation in a memory device in accordance with examples as disclosed herein.

In some memory devices, operations for accessing memory cells may be performed with timing that is asynchronous with an input signal (e.g., occurring at a different time than a rising edge transition or a falling edge transition of an input signal). Such operations may be triggered or otherwise supported by core timing signals of the memory device, which may be generated by a timing signal generation component of the memory device. To support asynchronous timing, a memory device may include delay components that support generating a timing signal having aspects that are delayed relative to an input signal, which may be received from or otherwise related to signaling from a host device. For example, a delay component may support generating an output timing signal having a rising edge that is delayed relative to a rising edge of an input signal, having a falling edge that is delayed relative to a falling edge of an input signal, having a falling edge that is delayed relative to a rising edge of an input signal, or various other configurations.

A delay component may include various circuit elements that impose an impedance between a signal input and a signal output, where a duration of a delay between the input signal and the output signal is based at least in part on the impedance. In some examples, a delay component may include circuitry configured with an RC delay, which refers to a delay supported by an impedance of a delay component that is related to a resistance of the circuitry and a capacitance of the circuitry. A memory device may include a resistor component or intrinsic resistance of a signal path to provide the resistance of such delay component circuitry. However, a resistor may be relatively large compared to other sources of impedance or other elements of a memory circuit, or may be formed with fabrication operations that are different than those of other surrounding components, which may involve circuit layout or circuit size limitations. Moreover, a resistor or other features of a delay component may be affected by variability, such as variations due to fabrication or operating conditions, such that timing signals may also be affected by such variability.

In accordance with examples as disclosed herein, a memory device may include delay components having a variable and configurable impedance, where the configurable impedance may be based at least in part on a configuration signal generated at the memory device. For example, a delay component that has a configurable impedance may include a transistor, where a resistance across the transistor (e.g., between a source node and a drain node) may be configurable by applying a configuration bias to a gate of the transistor. A configuration signal may be generated based on fabrication characteristics of the memory device, or based on operating conditions of the memory device, or some combination thereof, and may be used to reduce variability of timing signals that might otherwise be associated with process, voltage, or temperature variability. Moreover, using a transistor to provide an impedance (e.g., resistance) may support smaller layouts of a memory device, or improved flexibility for such layouts, among other benefits.

Features of the disclosure are initially described in the context of memory systems and dies as described with reference to FIGS. 1 and 2. Features of the disclosure are described in the context of delay circuitry as described with reference to FIGS. 3 through 5B. These and other features of the disclosure are further illustrated by and described with reference to an apparatus diagram and flowcharts that relate to timing signal delay compensation in a memory device as described with reference to FIGS. 6 through 8.

FIG. 1 illustrates an example of a system 100 that supports timing signal delay compensation in a memory device in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, CA channels 186 may be operable to communicate commands between the host device 105 and the memory device 110 including control information associated with the commands (e.g., address information).

In some examples, operations of the memory device 110 (e.g., for accessing memory cells of the memory arrays 170) may be performed with timing that is asynchronous with an input signal, such as a clock signal or command signal received from the host device 105 or otherwise generated at the memory device 110. To support asynchronous timing, a timing signal generation component of the memory device 110 (e.g., of the device memory controller 155, of one or more local memory controllers 165) may include delay components that generate a timing signal having a delay relative to an input signal. For example, a delay component may support generating an output timing signal (e.g., a delayed timing signal, a core timing signal) having a rising edge that is delayed relative to a rising edge of an input signal, having a falling edge that is delayed relative to a falling edge of an input signal, or various other configurations. A delayed timing signal may be used to trigger or initiate various asynchronous operations performed by the memory device 110.

A delay component may include various circuit elements that impose an impedance between a signal input and a signal output, where a duration of a delay between an input signal and an output signal is based at least in part on the impedance. In some examples, an impedance of a delay component may be affected by variability, such as variations due to fabrication or operating conditions, such that timing signals may also be affected by such variability. In accordance with examples as disclosed herein, the memory device 110 may include delay components having a variable and configurable impedance, where the configurable impedance may be based at least in part on a configuration signal generated at the memory device 110 (e.g., at a device memory controller 155, at a local memory controller 165). A configuration signal may be generated based on fabrication characteristics of the memory device 110, or based on operating conditions of the memory device 110 (e.g., operating voltage, operating temperature), or various combination thereof. In some examples, the described techniques for timing signal compensation may be used to reduce variability of timing signals that might otherwise be associated with process, voltage, or temperature variations, or may support smaller or more flexible component layout of the memory device 110, among other benefits.

Figure 2:
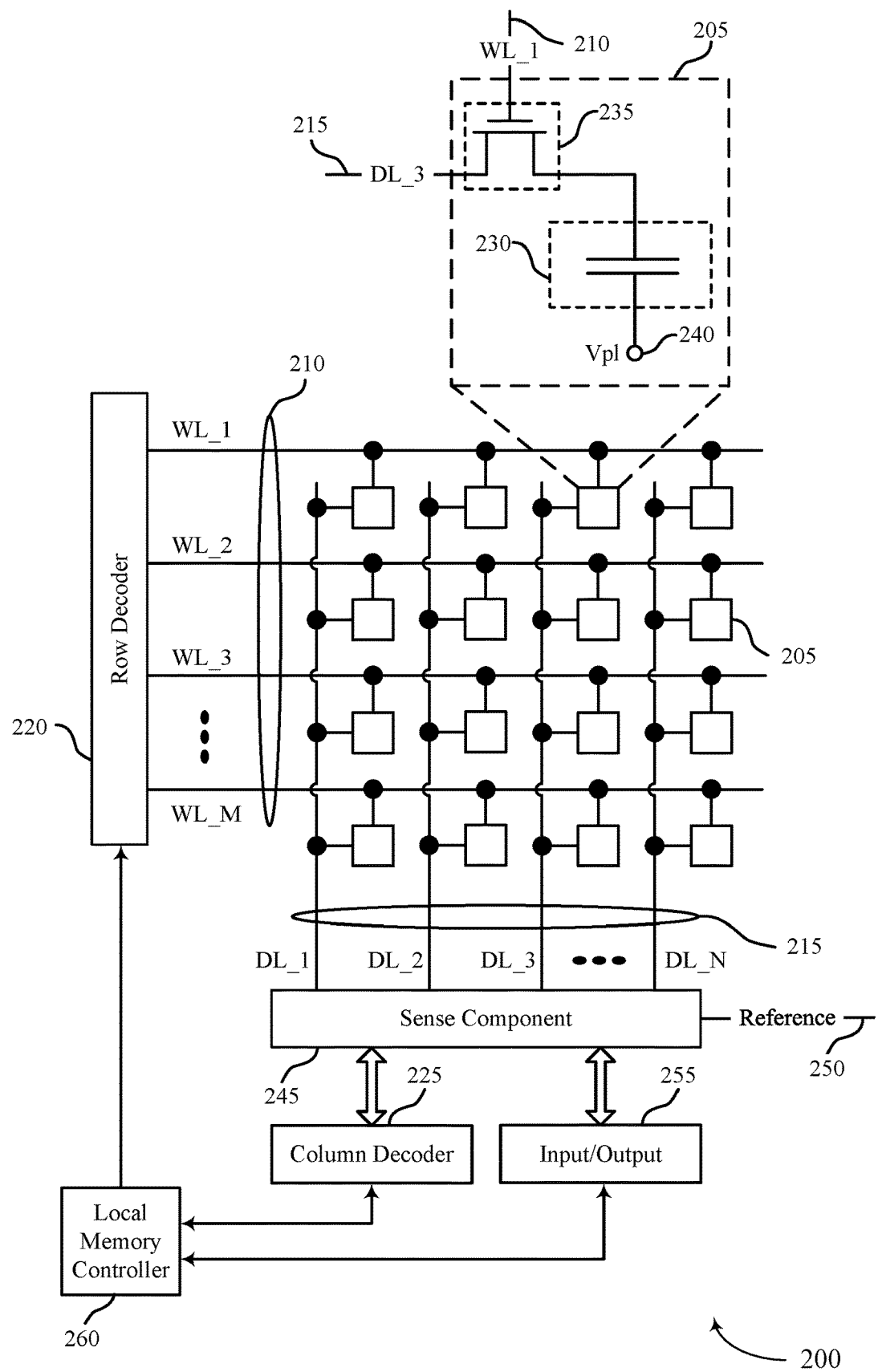
FIG. 2 illustrates an example of a memory die that supports timing signal delay compensation in a memory device in accordance with examples as disclosed herein.

FIG. 2 illustrates an example of a memory die 200 that supports timing signal delay compensation in a memory device in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground or virtual ground.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output component 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired logic state. The local memory controller 260 may identify a target memory cell 205 on which to perform the write operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The local memory controller 260 may apply a specific signal (e.g., write pulse) to the digit line 215 during the write operation to store a specific state (e.g., charge) in the capacitor 230 of the memory cell 205. The pulse used as part of the write operation may include one or more voltage levels over a duration.

The local memory controller 260 may be operable to perform a read operation (e.g., a sense operation) on one or more memory cells 205 of the memory die 200. During a read operation, the logic state stored in a memory cell 205 of the memory die 200 may be determined. The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference 250. Based on that comparison, the sense component 245 may determine a logic state that is stored on the memory cell 205.

In some examples, operations performed by the memory die 200 may be asynchronous relative to an input signal, such as a clock signal or command signal. For example, in response to a command signal associated with an access operation, the memory die 200 may perform a sequence of operations each having different initiation times (e.g., delays having different durations relative to the command signal or associated clock signal). In an example of a read operation, the memory die 200 may perform a sequence of operations that includes opening a row of memory cells (e.g., activating a word line 210 by the row decoder 220), selecting one or more columns of the memory cell (e.g., selecting one or more digit lines 215 at a column multiplexer of the column decoder 225), generating a read signal or latching a comparison between a read signal and a reference signal (e.g., at the sense component 245), or transmitting a result of the access operation (e.g., to the input/output component 255, from the input/output component 255), among other operations.

To support asynchronous timing, the memory die 200 may include delay components that support generating timing signals having aspects that are delayed relative to an input signal. In various examples, such delay components may be included in the local memory controller 260, distributed across one or more of the local memory controller 260, the row decoder 220, the column decoder 225, the sense component 245, or the input/output component 255, or various other configurations. In some examples, each portion of an access operation (e.g., sub-operation) may be associated with a respective delay component, which may generate a timing signal for the respective portion of the access operation. In various examples, portions of an access operation may be triggered or initiated based on the respective timing signal, such as upon a rising edge of the respective timing signal or upon a falling edge of the respective timing signal. For example, the memory die 200 may receive a clock signal or a command signal, and, supported by one or more delay components, may generate delayed timing signals that support such operations as the row decoder 220 opening a row of memory cells 205 (e.g., initiating the activation of a word line 210), the column decoder 225 activating one or more columns of memory cells 205 (e.g., initiating a column multiplexer signal), the sense component 245 generating or latching sense signals, the input/output component 255 latching or receiving an information exchange, among other operations.

Delay components of the memory die 200 may include various circuit elements that impose an impedance between a signal input and a signal output, where a duration of a delay between an input signal and an output signal is based at least in part on the impedance. In accordance with examples as disclosed herein, the memory die 200 may include delay components having a variable and configurable impedance, where the configurable impedance may be based at least in part on a configuration signal generated at a memory device 110 that includes the memory die 200 (e.g., a configuration voltage source of the memory die 200, a configuration voltage source of a device memory controller 155). A configuration signal may be generated based on fabrication characteristics of the memory device 110 or memory die 200, or based on operating conditions of the memory device 110 or memory die 200, or various combinations thereof. Such delay components may be used to reduce variability of timing signals that might otherwise be sensitive to process, voltage, or temperature variations, or may support smaller or more flexible component layout of the memory die 200, among other benefits.

Figure 3:
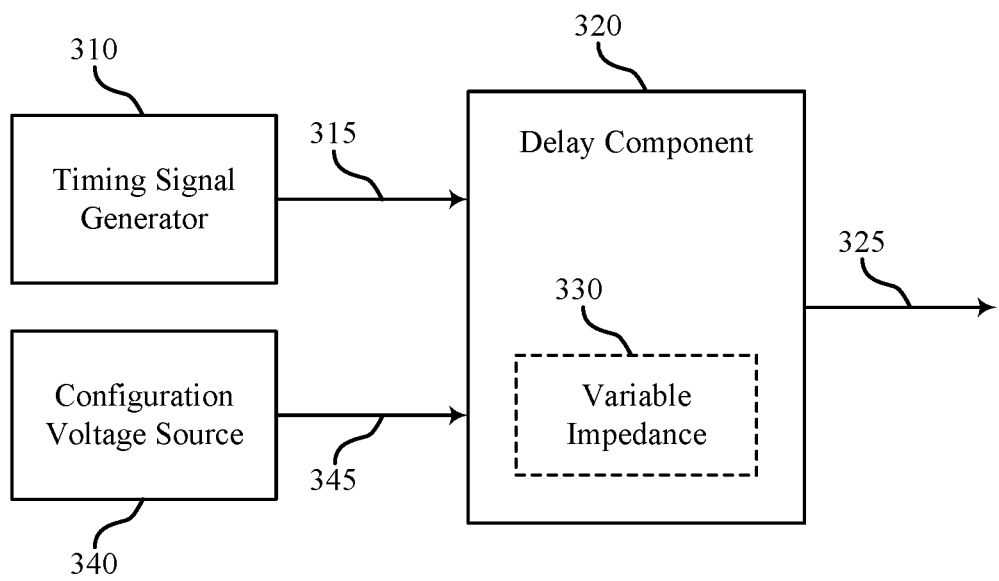
FIG. 3 illustrates a block diagram of a timing circuit that supports timing signal delay compensation in a memory device in accordance with examples as disclosed herein.

FIG. 3 illustrates a block diagram of a timing circuit 300 that supports timing signal delay compensation in a memory device in accordance with examples as disclosed herein. The timing circuit 300 includes a timing signal generator 310, a delay component 320, and a configuration voltage source 340 (e.g., a configuration voltage generator). In some examples, timing signal generator 310 may refer to a component that issues a clock signal, a command signal, or other synchronizing signal (e.g., as a component of a host device 105, as a component of a memory device 110). In some examples, the timing signal generator 310 may refer to a component that receives such a signal (e.g., as a command signal receiver of a memory device 110 or memory die 160, as a clock signal receiver of a memory device 110 or memory die 160. The delay component 320 may be configured to generate an output timing signal 325 having a delay relative to an input timing signal 315 received from the timing signal generator 310. The output timing signal 325 may be used to trigger or initiate various access operations (e.g., asynchronous operations) of a memory device 110 or memory die 160 that includes the timing circuit 300. For example, the output timing signal 325 may be used to support such operations as a row decoder 220 opening a row of memory cells 205, a column decoder 225 activating one or more columns of memory cells 205, a sense component 245 generating or latching sense signals, a input/output component 255 latching or receiving an information exchange, among other operations.

In some examples, a duration of a delay (e.g., an asynchronous delay) between an input timing signal 315 and an output timing signal 325 (e.g., between a rising edge of the input timing signal 315 and a rising edge of the output timing signal 325, between a falling edge of the input timing signal 315 and a falling edge of the output timing signal 325) may be based at least in part on an impedance of the delay component 320. In some examples, the delay component 320 may include circuitry configured with an RC delay, which refers to a delay supported by an that is related to a resistance of the circuitry and a capacitance of the circuitry. A memory device may include a resistor component or intrinsic resistance of a signal path to provide the resistance of such delay component circuitry. However, a resistor or intrinsic resistance of a signal path may occupy a relatively large area or volume compared to other sources of impedance or other circuit elements. Moreover, a resistor or intrinsic resistance may be formed with fabrication operations that are different than those of other surrounding components, or may involve relatively large separation spacing from other surrounding components. In some cases, including a resistor or intrinsic resistance to support the operation of the delay component 320 may involve circuit layout or circuit size limitations. Further, a resistor or other features of the delay component 320 may be affected by variability, such as variations due to fabrication or operating conditions, such that timing signals may also be affected by such variability.

The example of delay component 320 may include a variable impedance 330, which may be configured based at least in part on a configuration signal 345 received from the configuration voltage source 340. Accordingly, a duration of a delay between the output timing signal 325 and the input timing signal 315 may be configurable by way of the configuration signal 345. In various examples, the configuration signal 345 may be generated based at least in part on a process or fabrication characteristic or variation of a memory device 110 or memory die 160 that includes the timing circuit 300, or based at least in part on an operating condition (e.g., operating voltage, operating temperature) or characteristic of a memory device 110 or memory die 160 that includes the timing circuit 300, or various combinations thereof, which may mitigate associated variability in timing signals. In some examples, a configuration voltage source 340 may correspond to a single delay component 320. In some examples, a configuration voltage source 340 may common to or otherwise shared between more than one delay component 320 (e.g., sharing a configuration signal 345 among a plurality of delay components 320).

In some examples, the configuration voltage source 340 may support a reduction in timing signal variability related to process variations (e.g., fabrication or assembly variations of a memory device 110 or memory die 160 that includes the timing circuit 300). For example, the configuration voltage source 340 may include one or more components that are configurable based on an evaluation of performance characteristics of a particular memory device 110 or memory die 160. In one example, the configuration voltage source 340 may include a configurable resistance, which may include a trimmable or one-time programmable resistance or voltage divider set during a calibration operation (e.g., by way or a fuse or anti-fuse). In some examples, the configuration signal 345 may be based at least in part on passing a reference current through the configurable resistance or voltage divider.

In some examples, the configuration voltage source 340 may support a reduction in timing signal variability related to operational variations (e.g., voltage or temperature variations while operating a memory device 110 or memory die 160 that includes the timing circuit 300). For example, the configuration voltage source 340 may include one or more surrogate or reference components that are designed to mimic the operational characteristics or variations (e.g., voltage dependence, temperature dependence) of components of the delay component 320, such that the configuration signal 345 can be generated in a manner that stabilizes the delays of the delay component 320 or otherwise accommodates operational variations.

When the configuration voltage source 340 provides a configuration signal 345 to a plurality of delay components 320, the configuration voltage source 340 may include various components or circuitry to maintain a stable configuration signal 345 (e.g., to avoid or mitigate signal droop, for jitter reduction, for noise suppression). For example, the configuration voltage source 340 may include an amplifier, filtering components, or other circuitry for maintaining the configuration signal 345. In some examples, a configuration voltage source 340 may be fabricated with such components, and such components may be selectively enabled or disabled based on an operating mode of a memory device 110 or memory die 160 that includes the timing circuit 300, or such components may be selectively enabled or disabled as a one-time configuration operation during a manufacturing or assembly operation (e.g., by way of a fused or anti-fused selection).

In some examples, trimming or other configuration of the configuration voltage source 340 may be supported to set a level for a configuration signal 345 (e.g., to set a nominal delay of the delay component 320). In some cases, trimming or other configuration may support setting the configuration signal 345 to a level that supports reliability of a memory device 110 that includes the timing circuit 300 (e.g., setting the configuration signal 345 to be within or below a target voltage). In some cases, a configuration signal 345 may be monitored by a ring oscillator that operates, at least in part, on the configuration signal 345. In some examples, the configuration signal 345 may be monitored directly (e.g., to evaluate a level of the configuration signal 345 relative to a target).

Figure 4:
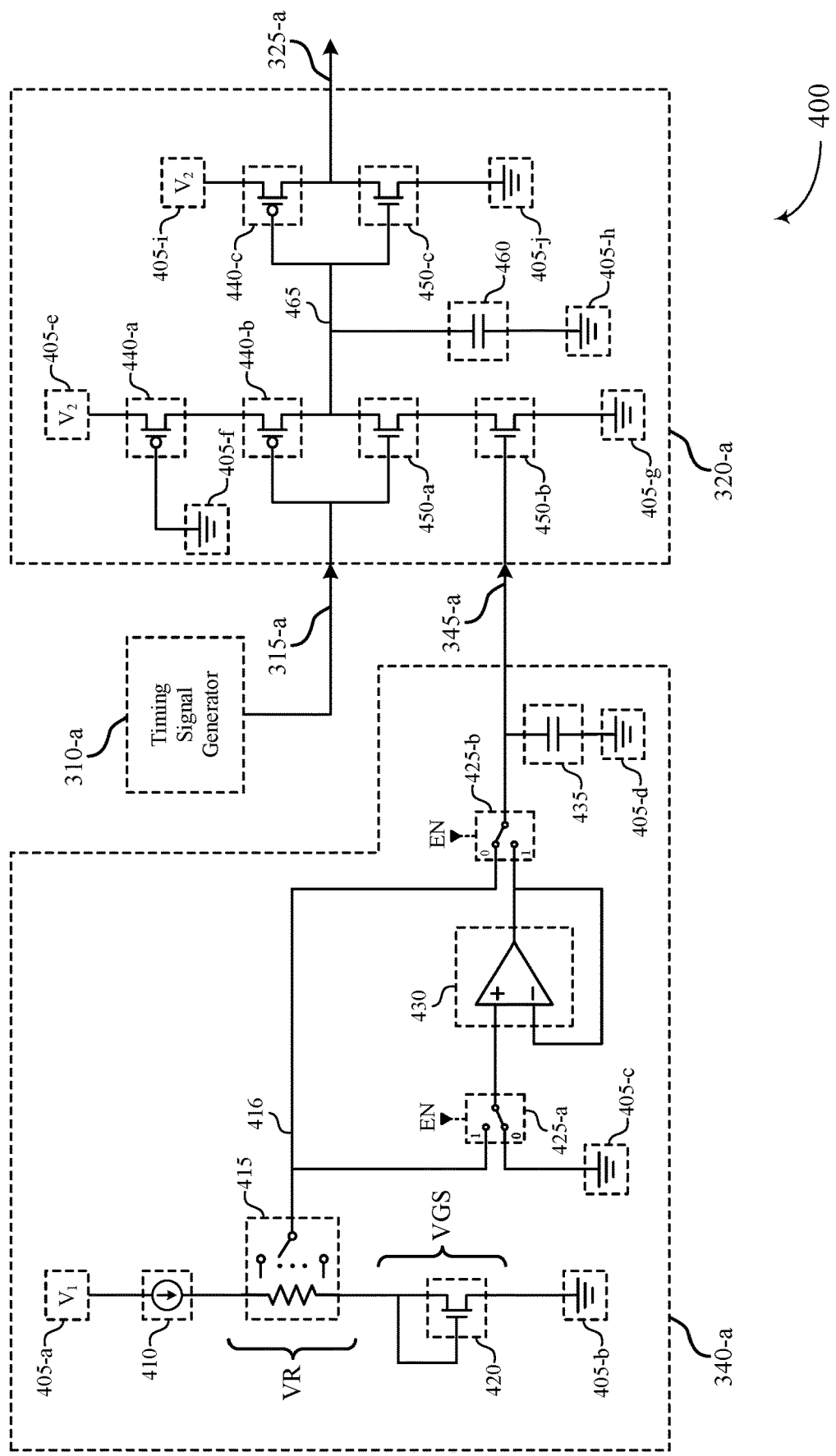
FIG. 4 illustrates an example of a timing circuit that supports timing signal delay compensation in a memory device in accordance with examples as disclosed herein.

FIG. 4 illustrates a block diagram of a timing circuit 400 that supports timing signal delay compensation in a memory device in accordance with examples as disclosed herein. The timing circuit 400 includes a timing signal generator 310-a, a delay component 320-a, and a configuration voltage source 340-a, which may be examples of the respective components described with reference to FIG. 3. The delay component 320-a may be configured to generate an output timing signal 325-a having a delay relative to an input timing signal 315-a received from the timing signal generator 310-a (e.g., over a signal path coupling the delay component 320-a with the timing signal generator 310-a).

The delay component 320-a may include p-type transistors 440 and n-type transistors 450 coupled with or between various voltage sources 405 of the delay component 320-a. In the example of delay component 320-a, the voltage sources 405-f, 405-g, 405-h, and 405-j may each refer to ground voltage sources of chassis ground nodes. The voltage sources 405-e and 405-i may be positive voltage sources, which may or may not have the same voltage level (e.g., $V_2$). In some examples, the voltage sources 405-e or 405-i may be associated with regulated voltage supplies of a memory device 110 or a memory die 160. In one example, the voltage $V_2$ may refer to a voltage level associated with triggering or initiating access operations (e.g., when the output timing signal 325-a is associated with a logical signal having a magnitude equal to or approximately equal to $V_2$, or a magnitude of $V_2$ minus a voltage drop across p-type transistor 440-c). The delay component 320-a may be configured to introduce a delay between a falling edge of the input timing signal 315-a and a falling edge of the output timing signal 325-a, and introduce a delay between a rising edge of the input timing signal 315-a and a rising edge of the output timing signal 325-a.

For example, on a falling edge of the input timing signal 315-a, the n-type transistor 450-a may transition to being deactivated (e.g., disconnecting or opening a conductive path between a source node and a drain node of the n-type transistor 450-a), and the p-type transistor 440-b may transition to being activated (e.g., connecting or closing a conductive path between a source node and a drain node of the p-type transistor 440-b). Accordingly, a conductive path may be formed between the voltage source 405-e and the central node 465 of the delay component 320-a. As fed by the voltage source 405-e, charge may accumulate at the capacitor 460 (e.g., according to a voltage difference between the central node 465 and the voltage source 405-h), and voltage at the central node 465 may rise according to a time constant or other increasing behavior related to the impedance of the activated signal path. For example, the voltage of the central node 465 may rise according to an RC time constant associated with a capacitance of the capacitor 460 and a resistance through the p-type transistor 440-a and the p-type transistor 440-b. When the voltage of the central node 465 exceeds a threshold voltage of the n-type transistor 450-c, the n-type transistor 450-c may be activated, coupling the output signal path of the delay component 320-a with the voltage source 405-j (e.g., a ground voltage source), thereby generating a falling edge of the output timing signal 325-a according to a delay that is associated with the impedance of the delay component 320-a (e.g., an RC impedance between the voltage source 405-e and the central node 465).

In some examples, the resistance through the p-type transistor 440-b may be relatively small, such that the resistance of the signal path activated on a falling edge of the input timing signal 315-a may be dominated by the p-type transistor 440-a. For example, the p-type transistor 440-a may be relatively long in a length dimension (e.g., of a gate of the p-type transistor 440-*a*), and may be referred to as a "long L gate" transistor. In some examples, the p-type transistor 440-*a* may be configured to have a nominal resistance that is based at least in part on the bias applied to the gate node (e.g., using the voltage source 405-*f*). In some examples, the p-type transistor 440-*a* may be sensitive to process, voltage, or temperature variability, and therefore a delay between a falling edge of the input timing signal 315-*a* and a falling edge of the output timing signal 325-*a* may also be subject to variability. However, some operations of a memory device 110 may be less sensitive to falling edge timing variation, and therefore the delay component 320-*a* may illustrate an example that avoids complexity related to managing falling edge variability in favor of reduced complexity or reduced circuit size. The falling edge delay of the delay component 320-*a* and the impedance (e.g., resistance) of the p-type transistor 440-*a* may each be examples of aspects of the delay component 320-*a* that are independent of the configuration signal 345-*a*.

On a rising edge of the input timing signal 315-*a*, the p-type transistor 440-*b* may transition to being deactivated (e.g., disconnecting or opening a conductive path between a source node and a drain node of the p-type transistor 440-*b*), and the n-type transistor 450-*a* may transition to being activated (e.g., connecting or closing a conductive path between a source node and a drain node of the n-type transistor 450-*a*). Accordingly, a conductive path may be formed between the voltage source 405-*g* and the central node 465 of the delay component 320-*a*. As drained into the voltage source 405-*g*, charge may dissipate from the capacitor 460 (e.g., according to a voltage difference between the central node 465 and the voltage source 405-*h*), and voltage at the central node 465 may fall according to a time constant or other decreasing behavior related to the impedance of the activated signal path. For example, the voltage of the central node 465 may fall according to an RC time constant associated with a capacitance of the capacitor 460 and a resistance through the n-type transistor 450-*a* and the n-type transistor 450-*b*, which may be longer than, shorter than, or nominally equal to the RC time constant associated with a capacitance of the capacitor 460 and the resistance through the p-type transistor 440-*a* and the p-type transistor 440-*b*. When the voltage of the central node 465 drops below a threshold voltage of the p-type transistor 440-*c*, the p-type transistor 440-*c* may be activated, coupling the output of the delay component 320-*a* with the voltage source 405-*i* (e.g., a positive voltage source), thereby generating a rising edge of the output timing signal 325-*a* according to a delay that is associated with the impedance of the delay component 320-*a* (e.g., an RC impedance between the voltage source 405-*g* and the central node 465).

In some examples, the resistance through the n-type transistor 450-*a* may be relatively small, such that the resistance of the signal path activated on a rising edge of the input timing signal 315-*a* may be dominated by the n-type transistor 450-*b*. For example, the n-type transistor 450-*b* may be relatively long in a length dimension (e.g., of a gate of the n-type transistor 450-*b*), and may be referred to as a "long L gate" transistor. In some examples, the n-type transistor 450-*b* may be associated with a variable and configurable impedance of the delay component 320-*a*. For example, a resistance through the n-type transistor 450-*b* (e.g., a resistance between a source node and drain node of the n-type transistor 450-*b*) may be configurable based at least in part on a voltage applied at the gate of the n-type transistor 450-*b* (e.g., by way of configuration signal 345-*a*).

With a relatively lower voltage of the configuration signal 345-*a*, the resistance through the n-type transistor 450-*b* may be relatively higher, corresponding to a relatively longer delay between a rising edge of the input timing signal 315-*a* and a rising edge of the output timing signal 325-*a*. With a relatively higher voltage of the configuration signal 345-*a*, the resistance through the n-type transistor 450-*b* may be relatively lower, corresponding to a relatively shorter delay between a rising edge of the input timing signal 315-*a* and a rising edge of the output timing signal 325-*a*. The rising edge delay of the delay component 320-*a* and the impedance (e.g., resistance) of the n-type transistor 450-*b* may each be examples of aspects of the delay component 320-*a* that are based at least in part on the configuration signal 345-*a*.

The configuration voltage source 340-*a* may include various components configured to generate the configuration signal 345-*a* which, in some examples, may be configured to reduce or eliminate timing signal variability related to process or operational condition variability. In some examples, the configuration signal 345-*a* may be based at least in part on a current path through the configuration voltage source 340-*a*, such as a path between voltage source 405-*a* (e.g., a positive voltage source) and a voltage source 405-*b* (e.g., a ground voltage source). The current path may include a current regulator 410, configured to regulate a current through the path to a desired level. In some examples, a voltage drop between the voltage source 405-*a* and the voltage source 405-*b*, or some portion thereof, may be divided into a voltage dropped across a resistor component 415 (e.g., VR) and a voltage dropped across a transistor component 420 (e.g., VGS). The configuration signal 345-*a* may be based at least in part on a voltage of a node 416 of the configuration voltage source 340-*a*. In some cases, the voltage source 405-*a* or the current regulator 410 may support aspects of a current that is proportional to a temperature or proportional to an absolute temperature of the memory device.

The resistor component 415 may be an example of a configurable component (e.g., a trimmable resistance) of the configuration voltage source 340-*a* that may be adjusted to compensate for a process or fabrication condition of a memory device 110 or memory die 160. In various examples, the resistor component 415 may be a configurable resistance, or a configurable voltage divider, or some other circuit component with a configurable characteristic. In an example where the resistor component 415 is a configurable resistance, a resistance level may be configured according to an operating mode of a memory device 110, or set as a one-time configuration (e.g., as a trim setting, when the variable configurable resistance is a trimmable component). For example, the resistor component 415 may include a plurality of resistive paths (e.g., in parallel) that may be selectively enabled or disabled by way of setting a respective switch, fuse, or anti-fuse at one or more of the conductive paths to configure a variable resistance. In an example where the resistor component is a configurable voltage divider, a proportion of the voltage, VR, mapped to or coupled with the node 416 may be configured according to an operating mode of a memory device 110, or set as a one-time configuration (e.g., as a trim setting, when the variable voltage divider is a trimmable component). For example, the resistor component 415 may include a plurality of resistive paths (e.g., in series), where one of a set of tap lines (e.g., each terminating between a different pair of the resistive paths) may be selectively coupled with the node 416 by way of setting a respective switch, fuse, or anti-fuse at one or more of the set of tap lines to configure a proportion of the voltage, VR, mapped to the node 416. In various examples, the resistor component 415 may support a capability for calibrating the configuration signal 345-*a*, or a delay of the delay component 320-*a*, to a nominal value (e.g., compensating for process or fabrication variability). In some examples, a resistance of the resistor component 415 may be proportional to temperature, such that the voltage, VR, may also be proportional to temperature, which may support aspects of providing a voltage at node 416 that supports configurable delays that track temperature variations.

The transistor component 420 may be an example of a surrogate or reference component (e.g., a reference transistor) of the configuration voltage source 340-*a* that is configured to compensate for operating condition of a memory device 110 or memory die. In some examples, the voltage, VGS, may be equal to or otherwise associated with a threshold voltage of the transistor component 420. In some examples, the threshold voltage of the transistor component may depend on an operating condition of a memory device 110 or memory die, including a voltage dependence or temperature dependence, among others. Accordingly, the voltage drop across the transistor component 420 may be based at least in part on an operating condition of a memory device 110 or memory die 160, such that the voltage of the node 416, and the configuration signal 345-*a*, is also based at least in part on such an operating condition. In some examples, the dependence of the transistor component 420 to operating conditions may be the same as, similar to, or otherwise related to the dependence of the n-type transistor 450-*b* to operating conditions. In some examples, as temperature increases, a threshold voltage of the transistor component 420 may decrease, which may cause an increase in voltage at the node 416 and a corresponding increase in the voltage of configuration signal 345-*a*. The same temperature increase may otherwise be associated with an increase in resistance through the n-type transistor 450-*b* or other portion of the delay component 320-*b*, but may be compensated for, at least in part, by the increased voltage of the configuration signal 345-*a* increasing conductivity through the n-type transistor 450-*b*. In some examples, aspects of the operation of transistor component 420 may have an inverse or negative correlation with temperature, such that the voltage, VGS, is inversely proportional to temperature or otherwise negatively correlated with temperature, which may be used to track corresponding variations of the operation of n-type transistor 450-*b*. Thus, according to this example and others, the transistor component 420 may be configured to reduce or eliminate timing variability of the output timing signal 325-*a* that would otherwise be related to the operating condition sensitivity of the n-type transistor 450-*b*. In some examples, these and other operating characteristics may be supported by having the transistor component 420 share design or processing characteristics with the n-type transistor 450-*b*, such as being designed with the same or similar dimensions (e.g., gate length), or being fabricated during the same or similar operations, which may support providing a voltage at node 416 that supports configurable delays that track process variations.

Although the configuration voltage source 340-*a* is illustrated as being coupled with a single delay component 320-*a*, in some cases, a timing circuit may include a configuration voltage source 340 that is coupled with more than one delay component 320. In some examples, such a configuration voltage source 340, or other portions of a related circuit, may include components that support stabilization and noise reduction related to the configuration signal 345-*a*.

In one example, the configuration voltage source 340-*a* includes an amplifier 430 configured to support the configuration signal 345-*a* maintaining or tracking to a voltage of the node 416. In some examples, the amplifier 430 may be selectively enabled via one or more selection components (e.g., selection components 425-*a* and 425-*b*). When enabled (e.g., by way of logical signal EN, or corresponding one-time programmable or trimmable selection), the node 416 may be coupled with an input of the amplifier 430 and the output of the configuration voltage source 340-*a* may be coupled with an output of the differential amplifier. When disabled, the amplifier 430 may be bypassed, and the node 416 may be coupled (e.g., directly) with the output of the configuration voltage source 340-*a*. In some examples, the timing circuit 400 may be fabricated with the amplifier 430, but the amplifier 430 may be enabled or bypassed as part of a manufacturing or assembly operation (e.g., a trimming operation). Accordingly, the selection components 425 may be illustrative of a fuse/anti-fuse component that selectively closes or opens corresponding signal paths. In some cases, the configurations of the selection components 425 may be set during a manufacturing process or testing process associated with a memory device 110.

In another example, the configuration voltage source 340-*a* includes a capacitor 435 that may also be configured to support the configuration signal 345-*a* maintaining or tracking to a voltage of the node 416. In some examples, the capacitor 435 may support rejecting noise or disturbances that may otherwise be carried along a signal path between the configuration voltage source 340-*a* and one or more delay components 320. Although illustrated as a single capacitor within the illustrative boundary of the configuration voltage source 340, in some examples capacitors may be distributed at various locations along signal paths between the configuration voltage source 340-*a* and delay components 320, which may support suppression of local kickback noise.

Although the n-type transistor 450-*b* is illustrated as a single transistor, in some examples, the n-type transistor 450-*b* may be representative of a set of more than one n-type transistor that is configured with an aggregate resistance that supports a desired timing delay (e.g., RC timing delay) of the delay component. For example, switchable conductive paths of a plurality of n-type transistors may be arranged in a series connection to support an increase in aggregate resistance (e.g., compared to a single n-type transistor), and switchable conductive paths of a plurality of n-type transistors may be arranged in a parallel connection to support a decrease in aggregate resistance (e.g., compared to a single n-type transistor). In some cases, combinations of such n-type transistors may be fed with the same configuration signal 325 at each of the respective gate nodes.

Although the timing circuit 400 includes an example of configuration voltage source 340-*a*, which may support aspects of compensation for process, voltage, or temperature variability including those described herein, in some cases, the delay component 320-*a* may be supplied with a configuration signal 345-*a* directly from a voltage source. In one example, a configuration signal 345-*a* may be provided from a voltage source that is unregulated from the perspective of a memory device 110 or a memory die 160, such as a voltage source of a host device 105. In some cases, a configuration signal 345-*a* being provided by an unregulated voltage supply may be associated with relatively high variability, but may still provide some reduction in timing variability related to voltage variability, and such a configuration may be associated with relatively simple signal path routing or relatively smaller circuit layout. In another example, a configuration signal 345-*a* may be provided from a voltage source that is regulated by a memory device 110 or a memory die 160 (e.g., by a voltage regulator component). In some cases, a configuration signal 345-*a* being provided by an regulated voltage supply may be associated with relatively lower variability compared to being provided by an unregulated voltage supply, but such a configuration may be associated with relatively more complex signal path routing or relatively larger circuit layout. These and other configurations may be considered for timing circuits that omit a configuration voltage source 340, or include alternative configurations for a configuration voltage source 340.

In some examples, the timing circuit 400 may be configured to support selective coupling of one or more delay components 320 with a configuration voltage source 340 or with a voltage source. In some examples, a selective coupling may be supported by a selection component that supports selection based on an operating mode of a memory device 110 or a memory die 160. In some examples, a selective coupling may be supported by a trimmable or one-time configurable connection, such as a selective enabling or disabling of signal paths by way of fuses or anti-fuses.

In some examples, the timing circuit 400 may be configured to support selective coupling of one or more delay components 320 with a configuration voltage source 340 or with a voltage source. In some examples, a selective coupling may be supported by a selection component that supports selection based on an operating mode of a memory device 110 or a memory die 160. In some examples, a selective coupling may be supported by a trimmable or one-time configurable connection, such as a selective enabling or disabling of signal paths by way of fuses or anti-fuses.

Although the timing circuit 400 illustrates an example for providing a configurable delay between a rising edge of an input timing signal 315-*a* and a rising edge of an output timing signal 325-*a*, a configurable delay may additionally or alternatively be provided between a falling edge of an input timing signal 315-*a* and a falling edge of an output timing signal 325-*a*. In some examples, to support a configurable delay between falling edges, a delay component 320 may include a configuration signal 345 that is additionally or alternatively applied to a gate node of a p-type transistor 440 (e.g., p-type transistor 440-*a*), which may be the same configuration signal 345 that is applied to an n-type transistor 450 (e.g., n-type transistor 450-*b*), or a different configuration signal 345. In some examples, to support a configurable delay between falling edges, the domain of a delay component 320 may be inverted by including a first inverter between a timing signal generator 310 and a delay component 320 and including a second inverter between the delay component 320 and a receiver of the output timing signal 325-*a*. In the context of the delay component 320-*a*, for example, a configurable delay may still be associated with rising edges of signals within the delay component 320-*a*, but by including inverters before and after the delay component 320-*a*, those rising edges would correspond to falling edges of input timing signals 315-*a* and output timing signals 325-*a*.

Figure 5A:
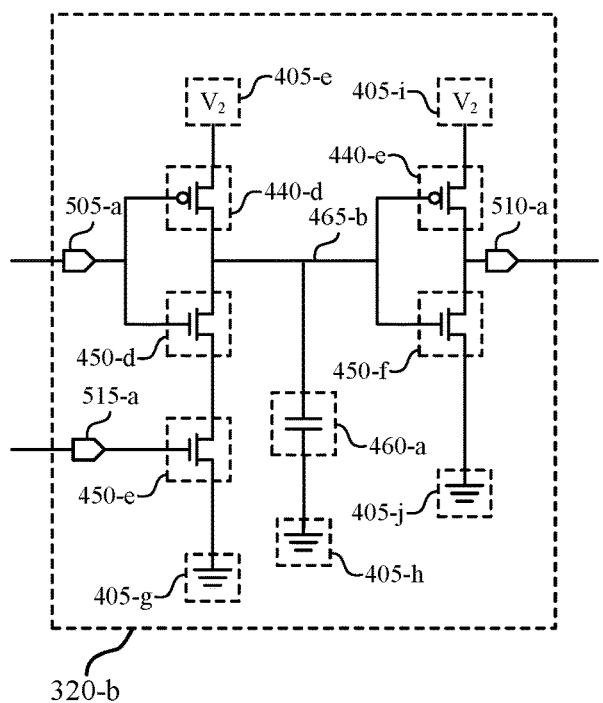
FIGS. 5A and 5B illustrate examples of delay components that support timing signal delay compensation in a memory device in accordance with examples as disclosed herein.
Figure 5B:
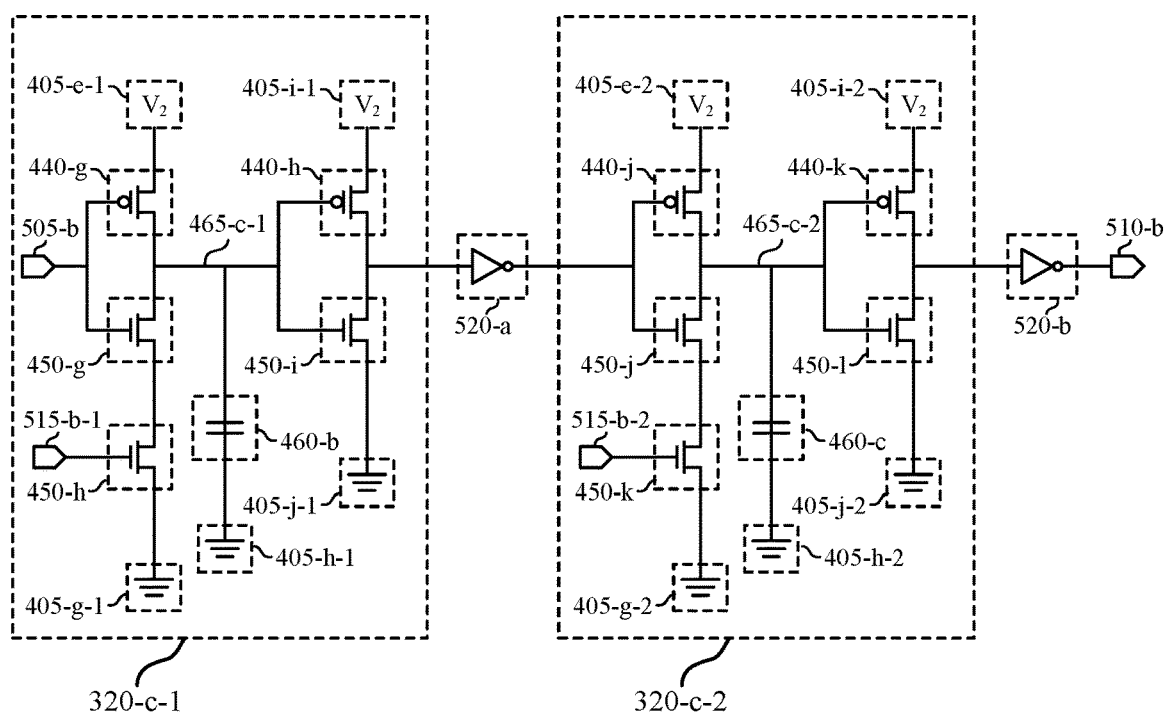

FIGS. 5A and 5B illustrate examples of delay components 320-*b*, 320-*c*-1, and 320-*c*-2, that support timing signal delay compensation in a memory device in accordance with examples as disclosed herein. The delay components 320-*b*, 320-*c*-1, and 320-*c*-2 may be examples of aspects of delay components 320 described with reference to FIGS. 3 and 4.

The delay components 320-*b*, 320-*c*-1, and 320-*c*-2 may be configured to generate output timing signals, at respective timing signal outputs 510, having delays relative to input timing signals, received at respective timing signal inputs 505. Each of the delay components 320 may include a variable impedance configurable by way of a configuration signal 345, received at respective configuration signal inputs 515.

The delay components 320-*b*, 320-*c*-1, and 320-*c*-2 may include p-type transistors 440 and n-type transistors 450 coupled with or between various voltage sources 405 of the delay component 320-*a*. In the example of delay components 320-*b*, 320-*c*-1, and 320-*c*-2, the voltage sources 405-*f*, 405-*g*, 405-*h*, and 405-*j* may each refer to ground voltage sources of chassis ground nodes. The voltage sources 405-*e* and 405-*i* may be positive voltage sources, which may or may not have the same voltage level (e.g., $V_2$).

As illustrated in FIG. 5A, the delay component 320-*b* may be configured to introduce a delay between a rising edge of an input timing signal and a rising edge of an output timing signal, and a smaller or negligible (e.g., zero) delay between a falling edge of an input timing signal and a falling edge of an output timing signal. For example, by omitting a p-type transistor 440 between the voltage source 405-*a* and the p-type transistor 440-*d*, a resistance of a signal path activated on a falling edge of an input timing signal may be relatively smaller or negligible (e.g., relative to the delay component 320-*a* described with reference to FIG. 4). Thus, the delay component 320-*b* may generate a falling edge of an output timing signal according to a relatively smaller or negligible delay, associated with an RC impedance between the voltage source 405-*e* and the central node 465-*b*. However, the delay component 320-*b* includes an n-type transistor 450-*e*, supporting a variable and configurable impedance of the delay component 320-*b*. Thus, the delay component 320-*b* may generate a rising edge of an output timing signal according to a delay having a duration that is based at least in part on the configurable impedance of the delay component 320-*b* (e.g., a configurable RC impedance between the voltage source 405-*g* and the central node 465-*b*, including the n-type transistor 450-*e*).

As illustrated in FIG. 5B, the delay components 320-*c*-1 and 320-*c*-2 may, collectively, be configured to introduce a first delay between a falling edge of an input timing signal (e.g., as received at timing signal input 505-*b*) and a falling edge of an output timing signal (e.g., as provided at timing signal output 510-*b*), and a second delay between a rising edge of an input timing signal and a rising edge of an output timing signal. In some examples, the delay component 320-*c*-1 may operate similarly to the delay component 320-*b*, and the delay component 320-*c*-2 may also operate similarly to the delay component 320-*b* but in an inverted of flipped domain (e.g., as supported by inverters 520-*a* and 520-*b*).

For example, in response to a rising edge of an input timing signal, the delay component 320-*c*-1 may generate a rising edge of a first intermediate timing signal (e.g., as provided to the inverter 520-*a*) according to a delay, relative to the input timing signal (e.g., as received at 505-*b*), having a duration that is based at least in part on a configurable impedance of the delay component 320-*c*-1 (e.g., a first configurable RC impedance, between the voltage source 405-*g*-1 and the central node 465-*c*-1, including the capacitor 460-*b* and n-type transistor 450-*h*). The rising edge of the first intermediate timing signal may be inverted to a falling edge by the inverter 520-*a*, and the delay component 320-*c*-2 may generate a falling edge of a second intermediate timing signal (e.g., as provided to the inverter 520-*b*) according to a delay, relative to the inverted first intermediate timing signal, that is relatively small or negligible (e.g., associated with the relatively small resistance between voltage source 405-*e*-2 and the central node 465-*c*-2). The falling edge of the second intermediate timing signal may be inverted by the inverter 520-*b* and provided as a rising edge of the output timing signal at timing signal output 510-*b*. The rising edge of the output timing signal may have a delay, relative to the input timing signal, that is accordingly based at least in part on the variable impedance configured by the configuration signal received at the configuration signal input 515-*b*-1. In some cases, the rising edge timing delay may be independent of a configuration signal received at the configuration signal input 515-*b*-2, and accordingly may be tuned independently of a falling edge timing delay.

In response to a falling edge of an input timing signal, the delay component 320-*c*-1 may generate a falling edge of the first intermediate timing signal (e.g., as provided to the inverter 520-*a*) according to a delay, relative to the input timing signal, that is relatively small or negligible (e.g., associated with the relatively small resistance between voltage source 405-*e*-1 and the central node 465-*c*-1). The falling edge of the first intermediate timing signal may be inverted to a rising edge by the inverter 520-*a*, and the delay component 320-*c*-2 may generate a rising edge of a second intermediate timing signal (e.g., as provided to the inverter 520-*b*) according to a delay, relative to the inverted intermediate timing signal, having a duration that is based at least in part on a configurable impedance of the delay component 320-*c*-2 (e.g., a second configurable RC impedance, between the voltage source 405-*g*-2 and the central node 465-*c*-2, including the capacitor 460-*c* and n-type transistor 450-*k*). The rising edge of the second intermediate timing signal may be inverted by the inverter 520-*b* and provided as a falling edge of the output timing signal at timing signal output 510-*b*. The falling edge of the output timing signal may have a delay, relative to the input timing signal, that is accordingly based at least in part on the variable impedance configured by the configuration signal received at the configuration signal receiver 515-*c*-1. In some cases, the falling edge timing delay may be independent of a configuration signal received at the configuration signal input 515-*b*-1, and accordingly may be tuned independently of a rising edge timing delay.

Thus, the delay components 320-*c*-1 and 320-*c*-2 may, collectively, be an example of a delay component supporting delays of both rising edges and falling edges that are based at least in part on a configuration signal (e.g., as received at configuration signal inputs 515-*b*-1 and 515-*b*-2. In various examples, delays between rising edges and delays between falling edges may be configured to be equal or different. For example, the capacitor 460-*b* may be configured with a capacitance that is the same as or different than a capacitance of the capacitor 460-*c*, or the n-type transistor 450-*h* may be configured with threshold voltage or other characteristic that is the same as or different than the n-type transistor 450-*k*. Additionally or alternatively, same or different configuration signals or voltage sources may be provided to or coupled with the configuration signal input 515-*b*-1 and configuration signal input 515-*b*-2.

Figure 6:
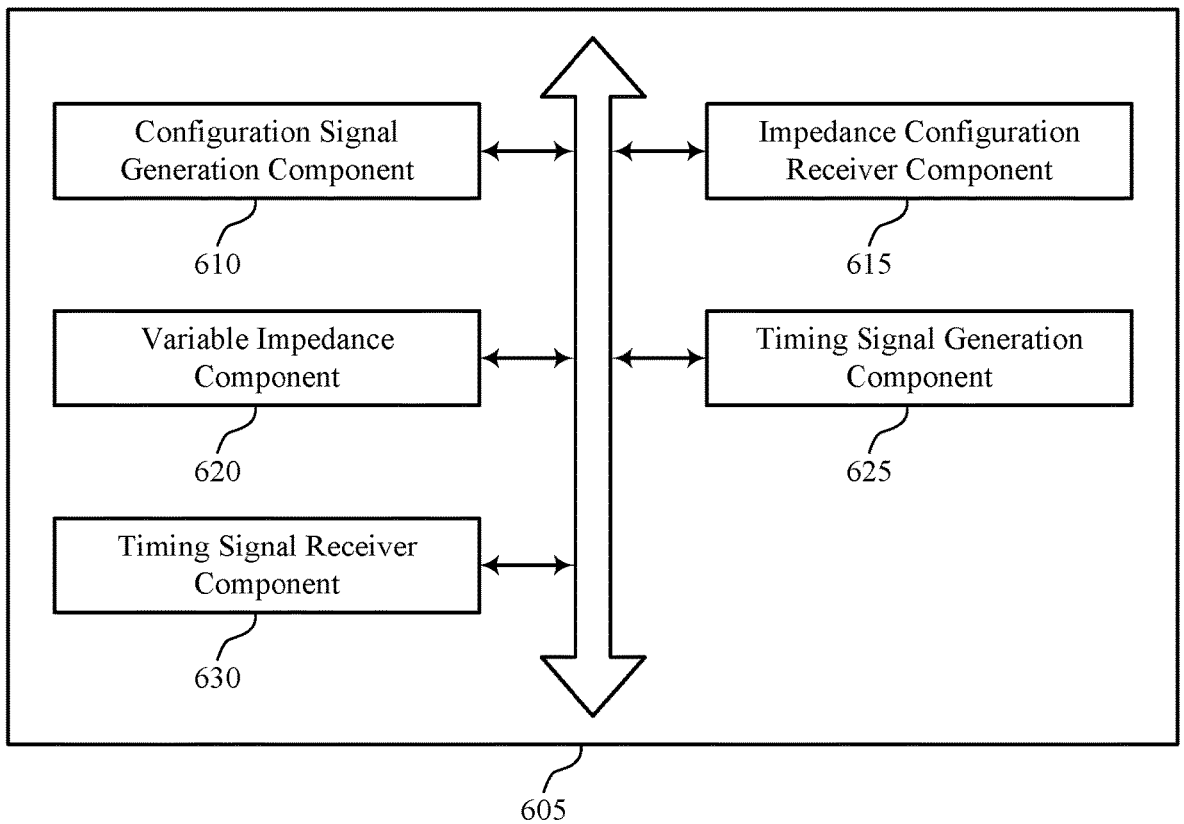
FIG. 6 shows a block diagram of a memory device that supports timing signal delay compensation in a memory device in accordance with aspects of the present disclosure.

FIG. 6 shows a block diagram 600 of a memory device 605 that supports timing signal delay compensation in a memory device in accordance with examples as disclosed herein. The memory device 605 may be an example of aspects of a memory device as described with reference to FIGS. 1 through 5B. The memory device 605 may include a configuration signal generation component 610, an impedance configuration receiver component 615, a variable impedance component 620, a timing signal generation component 625, and a timing signal receiver component 630. Each of these modules may communicate, directly or indirectly, with one another (e.g., via one or more buses).

In some examples, the configuration signal generation component 610 may generate, at a memory device, a voltage based on an operating condition of the memory device 605. In some examples, the configuration signal generation component 610 may apply a reference current through a reference transistor having a resistance that is based on the operating condition of the memory device 605, and generating the voltage may be based on applying the reference current through the reference transistor. In some examples, the configuration signal generation component 610 may apply a reference current through a trimmable (e.g., one-time programmable) resistance, and generating the voltage may be based on applying the reference current through the trimmable resistance. In some cases, the operating condition includes an operating temperature of the memory device, a process variation of a component of the memory device, a voltage of the memory device, or a combination thereof.

In some examples, the impedance configuration receiver component 615 may bias a gate of a transistor of a delay component using a voltage generated based on the operating condition. In some examples, the impedance configuration receiver component 615 may receive, at a delay component of a memory device, a first timing signal and an impedance configuration signal.

In some examples, the variable impedance component 620 may configure a variable impedance of a delay component based on biasing a gate of a transistor. In some examples, the variable impedance component 620 may configure an impedance of a delay component based on an impedance configuration signal. In some examples, the variable impedance component 620 may configure a resistance between a source of a transistor and a drain of the transistor based on biasing a gate of a transistor with an impedance configuration signal.

In some examples, the timing signal generation component 625 may delay a timing signal of an operation of the memory device based on configuring the variable impedance. In some examples, the timing signal generation component 625 may generate a second timing signal based on the first timing signal and the impedance configuration signal, where the second timing signal is delayed relative to the first timing signal based on the configured impedance of the delay component. In some examples, the timing signal generation component 625 may delay a rising edge of the timing signal, relative to a rising edge of the input signal, based on configuring the variable impedance.

In some examples, the timing signal generation component 625 may delay a falling edge of the timing signal relative to a falling edge of the input signal based on configuring the variable impedance. In some examples, the timing signal generation component 625 may delay a rising edge of the timing signal relative to a rising edge of the input signal with a first delay based on configuring a first variable impedance, and delay a falling edge of the timing signal relative to a falling edge of the input signal with a second delay based on configuring a second variable impedance. In some examples, the timing signal generation component 625 may generate the second timing signal with a rising edge that is delayed, relative to a rising edge of the first timing signal, with a delay that is based on configuring the impedance of the delay component.

In some examples, the timing signal generation component 625 may generate the second timing signal with a falling edge that is delayed, relative to a falling edge of the first timing signal, with a second delay that is independent from configuring the impedance of the delay component. In some examples, the timing signal generation component 625 may generate the second timing signal with a falling edge that is delayed, relative to a falling edge of the first timing signal, with a delay that is based on configuring the impedance of the delay component. In some examples, the timing signal generation component 625 may generate the second timing signal with a rising edge that is delayed, relative to a rising edge of the first timing signal, with a first delay that is based on configuring the impedance of the delay component, and generate the second timing signal with a falling edge that is delayed, relative to a falling edge of the first timing signal, with a second delay that is based on configuring the impedance of the delay component.

The timing signal receiver component 630 may receive an input signal for operating the memory device at the delay component, where delaying the timing signal includes delaying the timing signal relative to the input signal based on configuring the variable impedance.

Figure 7:
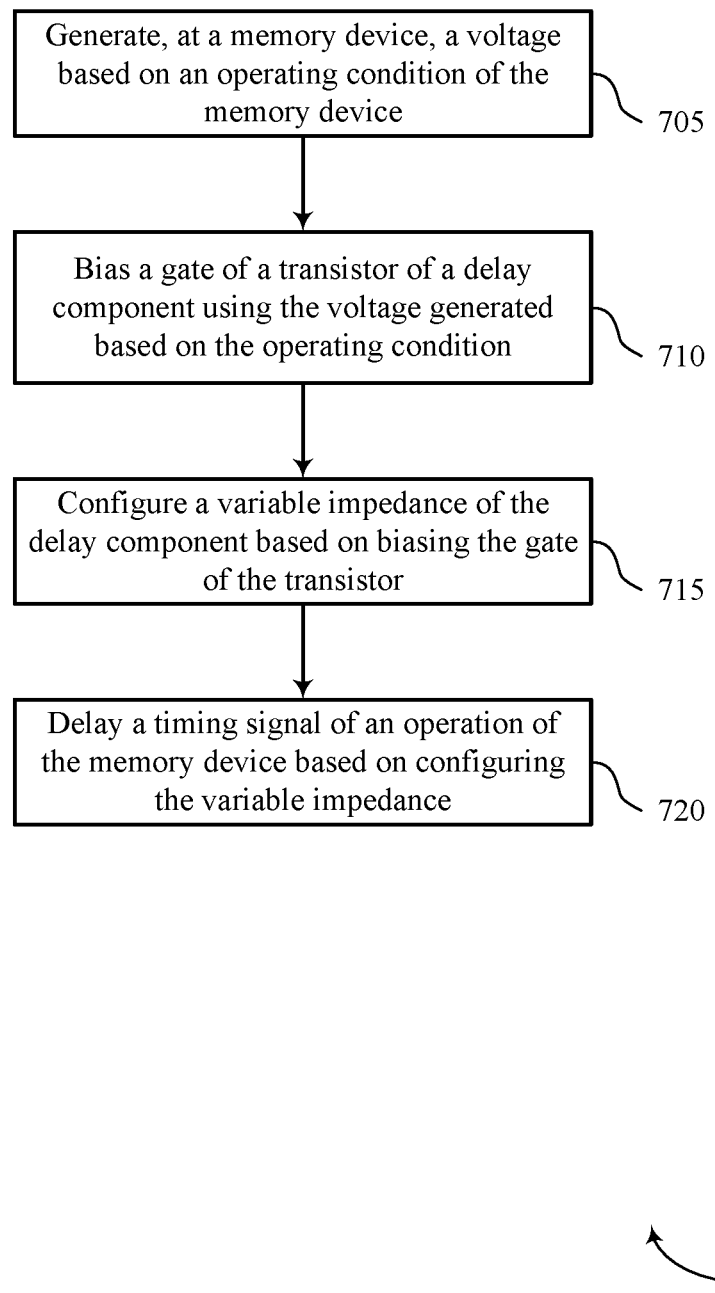
FIGS. 7 and 8 show flowcharts illustrating a method or methods that support timing signal delay compensation in a memory device in accordance with examples as disclosed herein.

FIG. 7 shows a flowchart illustrating a method or methods 700 that supports timing signal delay compensation in a memory device in accordance with aspects of the present disclosure. The operations of method 700 may be implemented by a memory device or its components as described herein. For example, the operations of method 700 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 705, the memory device may generate a voltage based on an operating condition of the memory device. The operations of 705 may be performed according to the methods described herein. In some examples, aspects of the operations of 705 may be performed by a configuration signal generation component as described with reference to FIG. 6.

At 710, the memory device may bias a gate of a transistor of a delay component using the voltage generated based on the operating condition. The operations of 710 may be performed according to the methods described herein. In some examples, aspects of the operations of 710 may be performed by an impedance configuration receiver component as described with reference to FIG. 6.

At 715, the memory device may configure a variable impedance of the delay component based on biasing the gate of the transistor. The operations of 715 may be performed according to the methods described herein. In some examples, aspects of the operations of 715 may be performed by a variable impedance component as described with reference to FIG. 6.

At 720, the memory device may delay a timing signal of an operation of the memory device based on configuring the variable impedance. The operations of 720 may be performed according to the methods described herein. In some examples, aspects of the operations of 720 may be performed by a timing signal generation component as described with reference to FIG. 6.

In some examples, an apparatus as described herein may perform a method or methods, such as the method 700. The apparatus may include features, circuitry, means, or instructions (e.g., a non-transitory computer-readable medium storing instructions executable by a processor) for generating, at a memory device, a voltage based on an operating condition of the memory device, biasing a gate of a transistor of a delay component using the voltage generated based on the operating condition, configuring a variable impedance of the delay component based on biasing the gate of the transistor, and delaying a timing signal of an operation of the memory device based on configuring the variable impedance.

Some examples of the method 700 and the apparatus described herein may further include operations, features, circuitry, means, or instructions for receiving an input signal for operating the memory device at the delay component, and delaying the timing signal may include delaying the timing signal relative to the input signal based on configuring the variable impedance.

In some examples of the method 700 and the apparatus described herein, delaying the timing signal may include operations, features, circuitry, means, or instructions for delaying a rising edge of the timing signal, relative to a rising edge of the input signal, based on configuring the variable impedance.

In some examples of the method 700 and the apparatus described herein, delaying the timing signal may include operations, features, circuitry, means, or instructions for delaying a falling edge of the timing signal relative to a falling edge of the input signal based on configuring the variable impedance.

In some examples of the method 700 and the apparatus described herein, delaying the timing signal may include operations, features, circuitry, means, or instructions for delaying a rising edge of the timing signal relative to a rising edge of the input signal with a first delay based on configuring a first variable impedance, and delaying a falling edge of the timing signal relative to a falling edge of the input signal with a second delay based on configuring a second variable impedance.

Some examples of the method 700 and the apparatus described herein may further include operations, features, circuitry, means, or instructions for applying a reference current through a reference transistor having a resistance that may be based on the operating condition of the memory device, and generating the voltage may be based on applying the reference current through the reference transistor.

Some examples of the method 700 and the apparatus described herein may further include operations, features, circuitry, means, or instructions for applying a reference current through a trimmable (e.g., one-time programmable) resistance, and generating the voltage may be based on applying the reference current through the trimmable resistance.

In some examples of the method 700 and the apparatus described herein, the operating condition includes an operating temperature of the memory device, a process variation of a component of the memory device, a voltage of the memory device, or a combination thereof.

Figure 8:
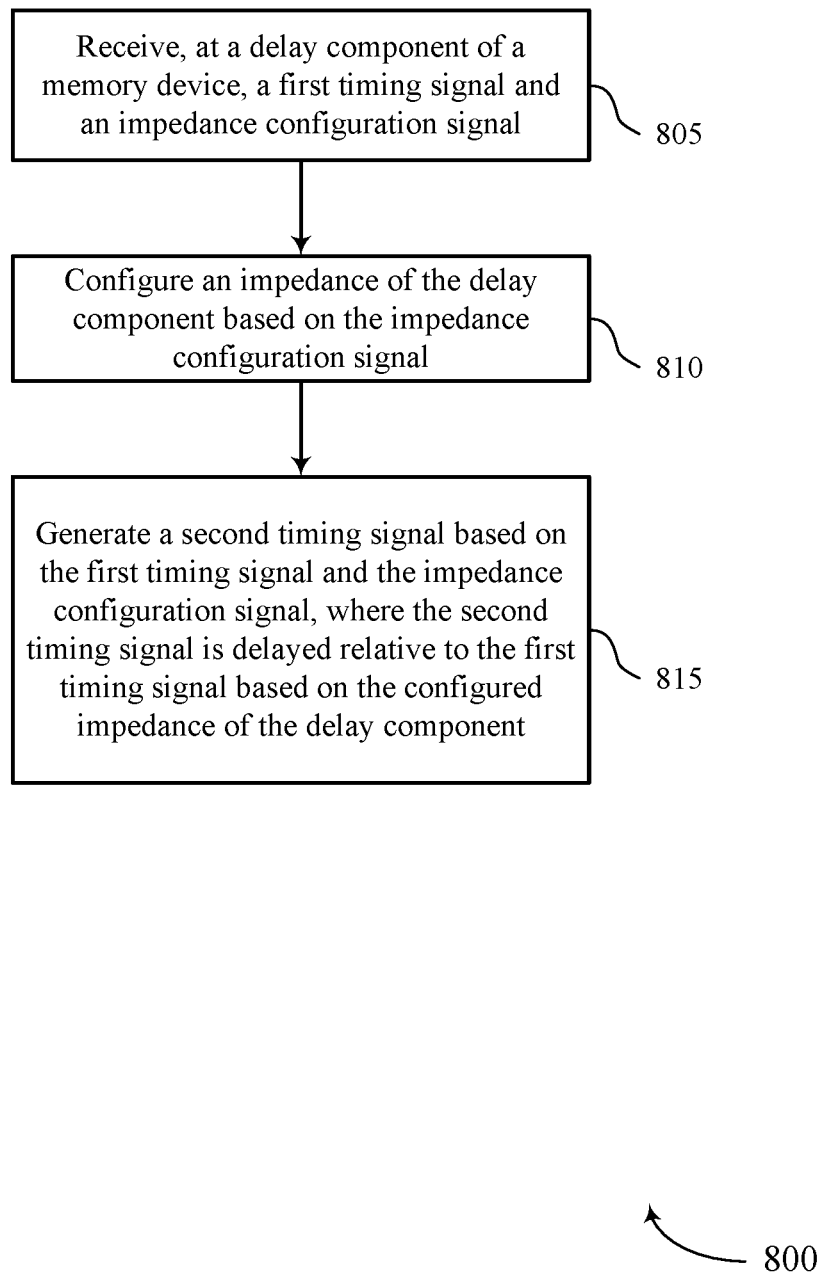

FIG. 8 shows a flowchart illustrating a method or methods 800 that supports timing signal delay compensation in a memory device in accordance with aspects of the present disclosure. The operations of method 800 may be implemented by a memory device or its components as described herein. For example, the operations of method 800 may be performed by a memory device as described with reference to FIG. 6. In some examples, a memory device may execute a set of instructions to control the functional elements of the memory device to perform the described functions. Additionally or alternatively, a memory device may perform aspects of the described functions using special-purpose hardware.

At 805, the memory device may receive, at a delay component of the memory device, a first timing signal and an impedance configuration signal. The operations of 805 may be performed according to the methods described herein. In some examples, aspects of the operations of 805 may be performed by an impedance configuration receiver component as described with reference to FIG. 6.

At 810, the memory device may configure an impedance of the delay component based on the impedance configuration signal. The operations of 810 may be performed according to the methods described herein. In some examples, aspects of the operations of 810 may be performed by a variable impedance component as described with reference to FIG. 6.

At 815, the memory device may generate a second timing signal based on the first timing signal and the impedance configuration signal, where the second timing signal is delayed relative to the first timing signal based on the configured impedance of the delay component. The operations of 815 may be performed according to the methods described herein. In some examples, aspects of the operations of 815 may be performed by a timing signal generation component as described with reference to FIG. 6.

In some examples, an apparatus as described herein may perform a method or methods, such as the method 800. The apparatus may include features, circuitry, means, or instructions (e.g., a non-transitory computer-readable medium storing instructions executable by a processor) for receiving, at a delay component of a memory device, a first timing signal and an impedance configuration signal, configuring an impedance of the delay component based on the impedance configuration signal, and generating a second timing signal based on the first timing signal and the impedance configuration signal, where the second timing signal is delayed relative to the first timing signal based on the configured impedance of the delay component.

In some examples of the method 800 and the apparatus described herein, configuring the impedance of the delay component may include operations, features, circuitry, means, or instructions for configuring a resistance between a source of a transistor and a drain of the transistor based on biasing a gate of the transistor with the impedance configuration signal.

In some examples of the method 800 and the apparatus described herein, generating the second timing signal may include operations, features, circuitry, means, or instructions for generating the second timing signal with a rising edge that is delayed, relative to a rising edge of the first timing signal, with a delay that is based on configuring the impedance of the delay component.

In some examples of the method 800 and the apparatus described herein, generating the second timing signal may include operations, features, circuitry, means, or instructions for generating the second timing signal with a falling edge that is delayed, relative to a falling edge of the first timing signal, with a second delay that is independent from configuring the impedance of the delay component.

In some examples of the method 800 and the apparatus described herein, generating the second timing signal may include operations, features, circuitry, means, or instructions for generating the second timing signal with a falling edge that is delayed, relative to a falling edge of the first timing signal, with a delay that is based on configuring the impedance of the delay component.

In some examples of the method 800 and the apparatus described herein, generating the second timing signal may include operations, features, circuitry, means, or instructions for generating the second timing signal with a rising edge that is delayed, relative to a rising edge of the first timing signal, with a first delay that is based on configuring the impedance of the delay component, and generating the second timing signal with a falling edge that is delayed, relative to a falling edge of the first timing signal, with a second delay that is based on configuring the impedance of the delay component.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a signal generator configured to generate a first timing signal for a memory device, a voltage source configured to generate a configuration voltage that is based on an operating condition of the memory device, and a delay component coupled with the signal generator and the voltage source, the delay component having a variable impedance that is configurable based on the configuration voltage, where the delay component is configured to generate a second timing signal having a delay, relative to the first timing signal, that is based on the variable impedance.

In some examples, the delay component includes a transistor, and the variable impedance includes a resistance of the transistor that may be configurable based on biasing a gate of the transistor with the configuration voltage.

In some examples, the delay component includes a capacitor, the delay component configured to generate the second timing signal having the delay that is based on the capacitor and the resistance of the transistor that is configurable based on biasing the gate of the transistor with the configuration voltage.

In some examples, the voltage source includes a reference transistor having a resistance that is based on the operating condition of the memory device, the voltage source configured to generate the configuration voltage based on the reference transistor.

In some examples, the voltage source includes a trimmable (e.g., one-time programmable) resistance, the voltage source configured to generate the configuration voltage based on the trimmable resistance.

In some examples, the voltage source includes an amplifier, an output of the amplifier coupled with a set of delay components including the delay component, and the voltage source configured to generate the configuration voltage based on the amplifier.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   receiving, at a delay component of a memory device, a first timing signal and an impedance configuration signal;
   configuring an impedance of the delay component based at least in part on the impedance configuration signal; and
   generating a second timing signal based at least in part on the first timing signal and the impedance configuration signal, wherein the second timing signal is delayed relative to the first timing signal based at least in part on the configured impedance of the delay component.

2. The method of claim 1, wherein configuring the impedance of the delay component comprises:
   configuring a resistance between a source of a transistor and a drain of the transistor based at least in part on biasing a gate of the transistor with the impedance configuration signal.

3. The method of claim 1, wherein generating the second timing signal comprises:
   generating the second timing signal with a rising edge that is delayed, relative to a rising edge of the first timing signal, with a delay that is based at least in part on configuring the impedance of the delay component.

4. The method of claim 3, wherein generating the second timing signal comprises:
   generating the second timing signal with a falling edge that is delayed, relative to a falling edge of the first timing signal, with a second delay that is independent from configuring the impedance of the delay component.

5. The method of claim 1, wherein generating the second timing signal comprises:
   generating the second timing signal with a falling edge that is delayed, relative to a falling edge of the first timing signal, with a delay that is based at least in part on configuring the impedance of the delay component.

6. The method of claim 1, wherein generating the second timing signal comprises:
   generating the second timing signal with a rising edge that is delayed, relative to a rising edge of the first timing signal, with a first delay that is based at least in part on configuring the impedance of the delay component; and
   generating the second timing signal with a falling edge that is delayed, relative to a falling edge of the first timing signal, with a second delay that is based at least in part on configuring the impedance of the delay component.

7. The method of claim 1, wherein generating the second timing signal comprises:
   generating the second timing signal with a rising edge that is delayed with a first delay relative to a rising edge of the first timing signal, and with a falling edge that is delayed with a second delay relative to a falling edge of the first timing signal, wherein the second delay is smaller than the first delay.

8. The method of claim 1, further comprising:
   receiving, at a second delay component of the memory device, the second timing signal and the impedance configuration signal;
   configuring a second impedance of the second delay component based at least in part on the impedance configuration signal; and
   generating a third timing signal based at least in part on the second timing signal and the impedance configuration signal, wherein the third timing signal is delayed relative to the second timing signal based at least in part on the configured second impedance of the second delay component.

9. The method of claim 8, wherein the third timing signal is based at least in part on an inversion of the second timing signal.

10. A memory device, comprising:
    a delay component configured to:
    receive a first timing signal and an impedance configuration signal;
    configure an impedance of the delay component based at least in part on the impedance configuration signal; and
    generate a second timing signal based at least in part on the first timing signal and the impedance configuration signal, wherein the second timing signal is delayed relative to the first timing signal based at least in part on the configured impedance of the delay component.

11. The memory device of claim 10, wherein to configure the impedance of the delay component, the delay component is further configured to:
    configure a resistance between a source of a transistor and a drain of the transistor based at least in part on biasing a gate of the transistor with the impedance configuration signal.

12. The memory device of claim 10, wherein to generate the second timing signal, the delay component is further configured to:
    generate the second timing signal with a rising edge that is delayed, relative to a rising edge of the first timing signal, with a delay that is based at least in part on configuring the impedance of the delay component.

13. The memory device of claim 10, wherein to generate the second timing signal, the delay component is further configured to:
    generate the second timing signal with a falling edge that is delayed, relative to a falling edge of the first timing signal, with a second delay that is independent from configuring the impedance of the delay component.

14. The memory device of claim 10, wherein to generate the second timing signal, the delay component is further configured to:
    generate the second timing signal with a falling edge that is delayed, relative to a falling edge of the first timing signal, with a delay that is based at least in part on configuring the impedance of the delay component.

15. The memory device of claim 10, wherein to generate the second timing signal, the delay component is further configured to:
  generate the second timing signal with a rising edge that is delayed, relative to a rising edge of the first timing signal, with a first delay that is based at least in part on configuring the impedance of the delay component; and
  generate the second timing signal with a falling edge that is delayed, relative to a falling edge of the first timing signal, with a second delay that is based at least in part on configuring the impedance of the delay component.

16. The memory device of claim 10, wherein to generate the second timing signal, the delay component is further configured to:
  generate the second timing signal with a rising edge that is delayed with a first delay relative to a rising edge of the first timing signal, and with a falling edge that is delayed with a second delay relative to a falling edge of the first timing signal, wherein the second delay is smaller than the first delay.

17. The memory device of claim 10, further comprising:
a second delay component configured to:
  receive the second timing signal and the impedance configuration signal;
  configure a second impedance of the second delay component based at least in part on the impedance configuration signal; and
  generate a third timing signal based at least in part on the second timing signal and the impedance configuration signal, wherein the third timing signal is delayed relative to the second timing signal based at least in part on the configured second impedance of the second delay component.

18. The memory device of claim 10, further comprising:
an inverter coupled with the delay component and configured to invert the second timing signal; and
a second delay component configured to:
  receive the inverted second timing signal from the inverter and the impedance configuration signal; and
  generate a third timing signal that is delayed relative to the second timing signal.

19. A memory device comprising:
a delay component configured to receive a first timing signal and an impedance configuration signal, the delay component comprising:
  a plurality of transistors coupled with a plurality of voltage sources; and
  a gate of a first transistor of the plurality of transistors biased with the impedance configuration signal to configure a resistance between a source of the first transistor and a drain of the first transistor, wherein an impedance of the delay component is configured based at least in part on the resistance;
  wherein the plurality of transistors are configured to generate a second timing signal such that the second timing signal is delayed relative to the first timing signal based at least in part on the configured impedance.

20. The memory device of claim 19, further comprising:
an inverter coupled with the delay component and configured to invert the second timing signal; and
a second delay component configured to:
  receive the inverted second timing signal from the inverter and the impedance configuration signal; and
  generate a third timing signal that is delayed relative to the second timing signal.

* * * * *